United States Patent [19]
Whelehan, Jr. et al.
[11] 3,829,787
[45] Aug. 13, 1974

[54] BROADBAND MILLIMETER WAVE PARAMETRIC AMPLIFIER

[75] Inventors: James J. Whelehan, Jr., Smithtown; Erich Henry Kraemer, Huntington, both of N.Y.

[73] Assignee: Cutler-Hammer, Inc., Milwaukee, Wis.

[22] Filed: Nov. 29, 1973

[21] Appl. No.: 420,279

[52] U.S. Cl. .................................... 330/4.9, 330/56
[51] Int. Cl. ............................................ H03f 7/04
[58] Field of Search ..................................... 313/4.9

[56] References Cited
UNITED STATES PATENTS
3,040,267 6/1962 Seidel ................................ 330/4.9

*Primary Examiner*—Herman Karl Saalbach
*Assistant Examiner*—Darwin R. Hostetter
*Attorney, Agent, or Firm*—Henry Huff

[57] ABSTRACT

A millimeter wave parametric amplifier including a series self-resonant varactor and a parallel resonant transmission cavity compensating the off-resonant variation in varactor reactance to extend the bandwidth of the amplifier. A low pump frequency is used, placing the idler frequency below the signal frequency. A waveguide beyond cutoff at the idler frequency, enclosing the varactor, minimizes idler power loss and aids in tuning the varactor to the idler frequency.

9 Claims, 2 Drawing Figures

BROADBAND MILLIMETER WAVE PARAMETRIC AMPLIFIER

BACKGROUND

1. Field

The invention relates to parametric amplifiers of the type in which a semiconductor diode is operated as a variable capacitor. A pump voltage, at a frequency above the signal frequency, is applied to the diode causing it to exhibit a negative resistance to the signal energy, thereby reflecting the signal with amplification.

2. Prior Art

Theoretical aspects of prior art parametric amplifiers are discussed in Greene, et al., Proceedings of the IEEE, September, 1960, pages 1583–1590, and the Bell Telephone System Monograph 3784, published in 1961. Methods for broadbanding such amplifiers are discussed in U.S. Pat. No. 3,040,267 to Seidel and in Sard, Symposium on Active Networks and Feedback Systems, pages 319–329, Polytechnic Institute of Brooklyn, April, 1960. To broadband the signal response, Seidel and Sard use a multi-pole filter which is both lossy and difficult to fabricate at millimeter wave frequencies. Seidel further complicates this approach by requiring the multi-pole filter to function as a transformer with a characteristic impedance which changes with varactor resistance as a function of frequency.

Ideally, the pump frequency should be as high as possible; however, pump sources, especially currently available solid state sources, are limited in their ability to supply pump power at millimeter wavelengths. Consequently, it is often necessary to operate with a relatively low pump-to-signal-frequency ratio which may cause the idler frequency to be below the signal frequency. When this occurs, the idler cannot be placed at the natural parallel resonance of the varactor to reduce loss because this resonance must be well above the signal frequency if acceptable parametric amplification is to take place.

SUMMARY

It is an object of this invention to provide a broadband millimeter wave parametric amplifier which can be operated with a relatively low frequency pump source.

According to this invention, broadbanding of a millimeter wave parametric amplifier is accomplished by a double tuned structure comprised of the varactor, which is series resonant at the nominal center frequency of the signal band, and a transmission cavity parallel resonant at the same frequency. The reactance of the varactor, which includes the reactance due to the series lead inductance, is compensated by the off-resonant reactance of the cavity thereby extending the bandwidth of the amplifier.

Low noise operation of a parametric amplifier requires the idler power to be confined to the varactor mount to prevent loading by either the signal or pump circuit. In the present invention, the varactor is surrounded by a waveguide beyond cutoff at the idler frequency which exhibits an inductive reactance used to tune the varactor to the idler frequency.

DESCRIPTION OF THE PREFERRED EMBODIMENT

Figure 1:
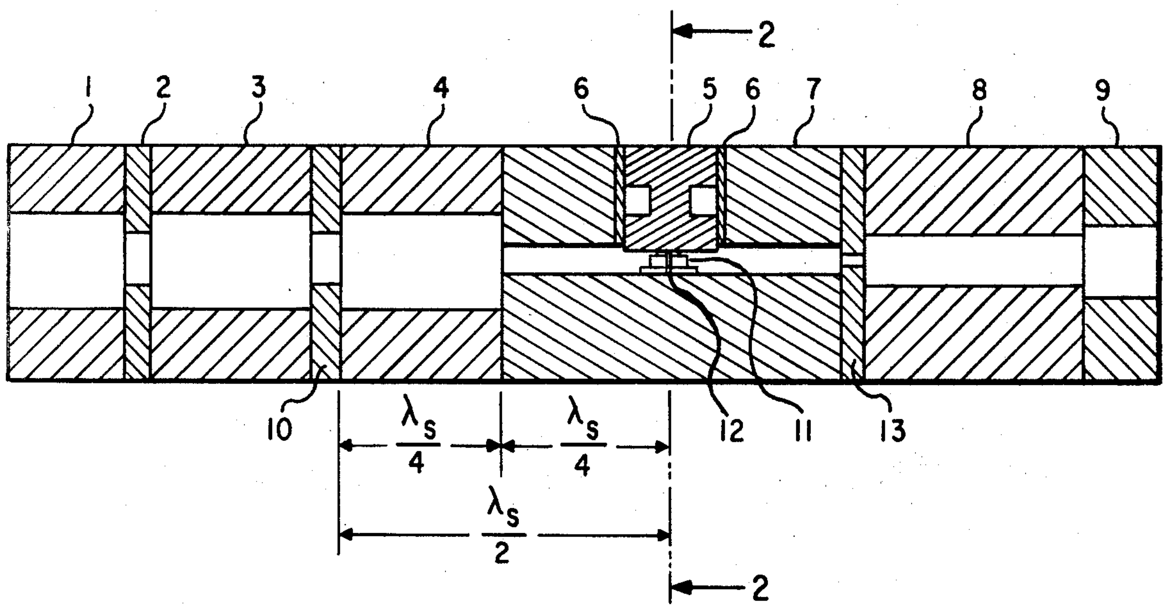
FIG. 1 is a longitudinal cross sectional view of a parametric amplifier illustrating a preferred embodiment of the invention.

Referring to FIG. 1, the varactor 11 is located in the center of a varactor mount comprised of a reduced height waveguide section 7 one-half wavelength long at the signal frequency, an inductive iris 12 located within the waveguide section in the same transverse plane as the varactor, and a connector 5 located above and making contact with the varactor. The relative locations of the iris, connector and varactor are shown in detail in FIG. 2.

Power at the signal frequency is transmitted from a signal port 1 through a resonant two port transmission cavity 3 to the varactor mount where it is amplified and reflected back through the same path to signal port 1. The transmission cavity is comprised of a waveguide section 3, a first iris 2, and a second iris 10, the irises being resonant at the nominal center frequency of the signal band and separated by a distance which resonates the cavity at the same frequency. The resonant irises are transparent to frequencies within the signal band, but not to frequencies outside this band. Matching between the signal port and the varactor mount is provided, in part, by an impedance transformation through the transmission cavity determined by the iris aperture size ratio. The cavity is designed to have a reactance slope equal in magnitude and opposite in sign to that of the varactor in the vicinity of the series resonant frequency of the varactor. The reactance slope is a function of cavity Q and is controlled by the size of the iris apertures.

Ideally, there should be no separation between one end of the cavity, as defined by iris 10, and the varactor; however, a mechanical interference between iris 10 and the connector 5 would occur and therefor the varactor is separated from the cavity by a one-half wavelength transmission line comprised of a one-quarter wavelength waveguide spacer 4 and the one-quarter wavelength section of the varactor mount between the spacer and the varactor. The spacer 5 and the varactor mount function as two cascaded one-quarter wavelength transformers which, in combination with the resonant cavity, match the varactor to the signal port. The series resonant varactor is resistive at the nominal center of the signal band and is seen as resistive when viewed from the cavity through the one-half wavelength section comprised of the cascaded transformers. Although any separation which avoids mechanical interference could be used, including a multiple quarter-wavelength section, a single half-wavelength separation is preferred to facilitate the cavity design and obtain a wide signal bandwidth.

The connector 5 serves as an RF return for the varactor to the waveguide at the signal, idler and pump frequencies. It also serves as a path for varactor bias as it is dc isolated from the waveguide by insulator 6.

Although the off-resonance varactor reactance, including that attributable to lead length, is compensated by the transmission cavity, the ultimate bandwidth over which compensation may be applied is limited by the series lead inductance. The reduced height waveguide in the varactor mount permits the connector to make direct contact with the varactor, eliminating the lead length required to bridge the height of a standard guide. The reduction in lead length is considerable as the height of a reduced height waveguide may be only ten percent of the height of a standard guide. As an example, the height of a reduced height waveguide in an embodiment of the present invention operating at a signal frequency of 60 GHz is 0.007 inch while the height of a standard guide is 0.074 inch. The approximately 60 ohm characteristic impedance of the reduced height waveguide is substantially less than the 600 ohm impedance of the 0.074 inch guide. The lower impedance of the reduced height guide aids in matching the −12 ohm impedance of the varactor to the higher impedance of the standard height guide. The reduction in waveguide height has no effect on the cutoff frequency as this parameter is determined solely by the guide width.

Pump power is supplied to the varactor mount through a pump input port 9, waveguide impedance transformer 8 and a pump iris 13 which is resonant at the pump frequency. The pump input port is matched to the varactor mount by this transformer and iris.

Pump power is prevented from entering the signal circuit by reflection from iris 10 while power at the signal frequency is prevented from entering the pump circuit by iris 13 and waveguide transformer 8 which is cut off at the signal frequency. Iris 13 reflects the signal power by presenting a low impedance at the signal frequency which is seen at the varactor as a high impedance through the one-quarter wavelength section of the varactor mount separating the varactor and iris 13.

In the past, idler isolation has been obtained by designing the varactor to have a self resonance at the idler frequency. This causes the idler power flow to be confined to the varactor or at most to include the transmission line adjacent to the varactor. In the present design, the idler is below the signal frequency and therefore below any natural resonant frequency of the varactor, yet the varactor must be decoupled from the signal and pump circuit at the idler frequency. At the same time, the varactor must be coupled to the signal and pump circuits at their respective frequencies. In the present invention, the waveguide which couples the signal and pump to the varactor is cut off at the idler frequency and the varactor is tuned to parallel resonance at the idler frequency by the inductance of the waveguide surrounding the varactor and the inductance of the iris located within this guide. The waveguide inductance tunes the varactor to a frequency slightly below the idler frequency while the iris adds sufficient inductance in parallel with the waveguide inductance to fine tune the varactor to the exact idler frequency.

The use of the inductive iris facilitates tuning the varactor to the idler frequency by permitting the dimensions of the reduced height waveguide to remain fixed once they have been determined. Only the iris need be trimmed to effect the final idler tuning adjustment, eliminating the need to refabricate the complete guide and possibly the matching transformers for the pump and signal circuits each time a tuning adjustment is required.

Figure 2:
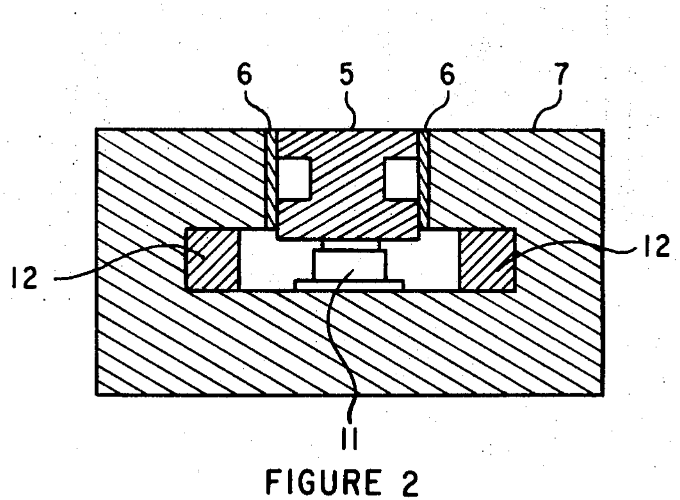
FIG. 2 is a transverse cross section of the structure of FIG. 1 in the plane 2—2.

A preferred location for the iris 12 is in the same transverse plane as the varactor in the reduced height waveguide. In this location, the iris and varactor appear as a single impedance at one longitudinal location in the guide, easing the design of the pump and signal matching circuits. Mechanical interference between the iris and the connector is avoided by the inherent separation between the walls of the inductive iris, which permits the connector to protrude into the waveguide to make contact with the varactor as shown in FIG. 2.

We claim:

1. A millimeter wave parametric amplifier comprising:

a. a signal port, b. a varactor series self-resonant at the nominal center frequency of the signal band, c. a signal line connected at one end to the varactor, d. a transmission cavity parallel resonant at said nominal center frequency of the signal band connected at one end to the signal port and at the other to the remaining end of the signal line, said cavity having a reactance slope which is substantially equal and opposite to that of the varactor in the vicinity of said series resonance frequency of the varactor to extend the signal bandwidth of the amplifier.

2. A millimeter wave parametric amplifier as described in claim 1, wherein said cavity constitutes a part of an impedance transformation network used to match the signal port to the varactor.

3. A millimeter wave parametric amplifier as described in claim 2, wherein said cavity is comprised of a hollow waveguide section with a first iris at one end of the waveguide section, and a second iris at the other end.

4. A millimeter wave parametric amplifier as described in claim 3, wherein said signal line is a multiple of a quarter wavelength long at the signal frequency.

5. A millimeter wave parametric amplifier as described in claim 3, wherein said signal line is one-half wavelength long at the signal frequency.

6. A millimeter wave parametric amplifier having a varactor which operates at an idler frequency below the signal frequency, wherein the improvement comprises:

a. a hollow waveguide beyond cutoff at the idler frequency surrounding the varactor and presenting a shunt inductance which tunes the varactor below the idler frequency, and b. means to present an inductance to the varactor which is in parallel with the inductance of the waveguide-beyond-cutoff to tune the varactor to the idler frequency.

7. A millimeter wave parametric amplifier as described in claim 6, wherein the means to present an inductance to the varactor is an inductive iris located in the transverse plane within the waveguide-beyond-cutoff which contains the varactor.

8. A millimeter wave parametric amplifier as described in claim 7, wherein the waveguide-beyond-cutoff is a reduced height waveguide.

9. A millimeter wave parametric amplifier as described in claim 8, wherein the reduced height waveguide varactor mount contains a connector which makes direct contact with the varactor minimizing series lead length to the varactor.

* * * * *